United States Patent
Noh et al.

(10) Patent No.: US 10,224,185 B2
(45) Date of Patent: Mar. 5, 2019

(54) SUBSTRATE PROCESSING APPARATUS

(71) Applicant: Samsung Electronics Co., Ltd., Suwon-si, Gyeonggi-do (KR)

(72) Inventors: Young-jin Noh, Suwon-si (KR); Kwang-min Park, Seoul (KR); Eun-sung Seo, Hwaseong-si (KR); Young-chang Song, Hwaseong-si (KR); Jae-young Ahn, Seongnam-si (KR); Hun-hyeong Lim, Hwaseong-si (KR); Ji-hoon Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 349 days.

(21) Appl. No.: 14/689,559

(22) Filed: Apr. 17, 2015

(65) Prior Publication Data

US 2016/0064190 A1 Mar. 3, 2016

(30) Foreign Application Priority Data

Sep. 1, 2014 (KR) .......................... 10-2014-0115690

(51) Int. Cl.
*C23C 16/455* (2006.01)
*H01J 37/32* (2006.01)

(52) U.S. Cl.
CPC .... *H01J 37/3244* (2013.01); *H01J 37/32091* (2013.01); *H01J 37/32522* (2013.01); *H01J 37/32779* (2013.01)

(58) Field of Classification Search
CPC ............ H01J 37/3244; H01J 37/32779; H01J 37/32522; H01J 37/32091; C23C 16/4558

USPC ..................................... 118/715; 156/345.33
See application file for complete search history.

(56) References Cited

U.S. PATENT DOCUMENTS

| | | | |
|---|---|---|---|
| 5,383,984 A | * | 1/1995 | Shimada ........... H01J 37/32522 118/723 ER |
| 6,110,286 A | | 8/2000 | Oh et al. |
| 6,139,642 A | * | 10/2000 | Shimahara .......... C23C 16/4401 118/715 |
| 7,235,138 B2 | | 6/2007 | Zheng et al. |
| 7,825,039 B2 | | 11/2010 | Takahashi et al. |

(Continued)

FOREIGN PATENT DOCUMENTS

| | | |
|---|---|---|
| JP | 1993-211122 A | 8/1993 |
| JP | 2008-258207 A | 10/2008 |

(Continued)

*Primary Examiner* — Rudy Zervigon
(74) *Attorney, Agent, or Firm* — Harness, Dickey & Pierce, P.L.C.

(57) ABSTRACT

A substrate processing apparatus including a process chamber configured to receive a plurality of substrates oriented in a horizontal manner and vertically arranged with respect to the process chamber, a process gas supply unit configured to supply at least one process gas to the process chamber through a process gas supply nozzle, the process gas supply nozzle along an inner wall of the process chamber in a direction in which the substrates are sacked, an exhaust unit configured to exhaust the process gas from the process chamber, and a blocking gas supply unit configured to supply a blocking gas through a blocking gas injector provided in a circumferential direction of the process chamber such that a flow of the process gas in the process chamber is controlled may be provided.

14 Claims, 17 Drawing Sheets

(56) References Cited

U.S. PATENT DOCUMENTS

| | | | |
|---|---|---|---|
| 7,828,898 B2* | 11/2010 | Maeda | C23C 16/45512 |
| | | | 118/715 |
| 7,833,351 B2 | 11/2010 | Webb et al. | |
| 8,461,062 B2 | 6/2013 | Sakai et al. | |
| 9,666,459 B2* | 5/2017 | Yang | H01L 21/67109 |
| 2003/0111013 A1 | 6/2003 | Oosterlaken et al. | |
| 2004/0115584 A1* | 6/2004 | Okabe | C23C 16/345 |
| | | | 432/200 |
| 2008/0251014 A1* | 10/2008 | Kontani | C23C 16/452 |
| | | | 118/715 |
| 2008/0268171 A1 | 10/2008 | Ma et al. | |
| 2009/0004405 A1 | 1/2009 | Merry et al. | |
| 2010/0154711 A1 | 6/2010 | Ishibashi et al. | |
| 2012/0135609 A1 | 5/2012 | Yudovsky et al. | |
| 2013/0327273 A1 | 12/2013 | Okada | |
| 2014/0261174 A1* | 9/2014 | Yang | H01L 21/67109 |
| | | | 118/715 |

FOREIGN PATENT DOCUMENTS

| | | |
|---|---|---|
| JP | 2009-200298 A | 9/2009 |
| KR | 10-0237822 B1 | 1/2000 |
| KR | 10-2009-0009572 A | 1/2009 |

\* cited by examiner

SUBSTRATE PROCESSING APPARATUS

CROSS-REFERENCE TO RELATED APPLICATION

This application claims priority under 35 U.S.C. § 119 to Korean Patent Application No. 10-2014-0115690, filed on Sep. 1, 2014, in the Korean Intellectual Property Office, the disclosure of which is incorporated herein in its entirety by reference.

BACKGROUND

The inventive concepts relates to substrate processing apparatuses, and more particularly, to substrate processing apparatuses capable of processing a substrate.

A substrate processing process, for example, a process of forming a thin film on a substrate or annealing the substrate may be performed in a substrate processing apparatus. The substrate processing apparatus may include a substrate boat in which a plurality of substrates may be loaded and stacked. When a thin film is formed on a plurality of substrates loaded in the substrate boat or the substrates are annealed, the substrate processing apparatus having improved in-wafer and/or wafer-to-wafer processing uniformities is desired.

SUMMARY

The inventive concepts provide substrate processing apparatuses capable of improving processing uniformity within respective substrates and/or between the substrates.

According to an aspect of the inventive concepts, a substrate processing apparatus includes a process chamber configured to receive a plurality of substrates oriented in a horizontal manner and vertically arranged with respect to the process chamber, a process gas supply unit configured to supply at least one process gas to the process chamber through a process gas supply nozzle, the process gas supply nozzle along an inner wall of the process chamber in a direction in which the substrates are sacked, an exhaust unit configured to exhaust the process gas in the process chamber, and a blocking gas supply unit configured to supply a blocking gas through a blocking gas injector provided in a circumferential direction of the process chamber such that a flow of the process gas in the process chamber is controlled.

The process gas supply nozzle may include a first process gas supply nozzle configured to inject a principal process gas for forming a thin film and a second process gas supply nozzle configured to inject a purge process gas. The process gas supply nozzle may include a plurality of process gas spray ports configured to spray the process gas toward surfaces of the substrates.

The exhaust unit may be at at least one of a lower portion of the process chamber and an upper portion of the process chamber. The blocking gas injector may be at at least one of a lower portion of the process chamber and an upper portion of the process chamber.

The blocking gas injector may include a plurality of blocking gas supply ports along a circumferential direction of the process chamber and be configured to spray the blocking gas into the process chamber.

The blocking gas injector may be one of adhered to a main body of the process chamber or and integrally attached to the main body of the process chamber. The substrate processing apparatus may further include a main control unit configured to control at least one of the process gas supply unit, the blocking gas supply unit, and the exhaust unit. The main control unit may be configured to control horizontal flow of the process gas into each of an upper portion, a central portion, and a lower portion of the process chamber.

A plasma generation unit may be at one side of the process chamber and configured to generate the plasma gas by exciting the process gas supplied into the process chamber.

According to another aspect of the inventive concepts, a substrate processing apparatus includes a process chamber configured to receive a plurality of substrates oriented in a horizontal manner and vertically arranged with respect to the process chamber, the process chamber including an upper end portion and a lower end portion, the upper end portion being above the substrate boat and sealed from the outside and the lower end portion below the substrate boat and being open, a cover unit configured to hermetically seal the lower end portion of the process chamber, a process gas supply unit configured to supply at least one process gas to the substrates stacked in the process chamber through a process gas supply nozzle, the process gas supply nozzle along an inner wall of the process chamber in a vertical direction of the substrate boat, an exhaust unit configured to exhaust the process gas in the process chamber, and a blocking gas supply unit configured to supply a blocking gas through a ring type blocking gas injector provided in a circumferential direction of the process chamber such that a flow of the process gas in the process chamber is controlled.

The process chamber may include an outer tube and an inner tube, which is within the outer tube and configured to accommodate the substrate boat. The exhaust unit may include an exhaust hole at one side of the process chamber and the exhaust hole faces the process gas supply nozzle.

The process gas supply nozzle may include a plurality of process gas spray ports configured to spray the process gas toward the substrates. The blocking gas injector may include a plurality of blocking gas spray ports configured to spray the blocking gas into at least one of the lower end portion hermetically sealed by the cover unit and an upper end portion.

The blocking gas spray ports may be installed in a circumferential direction of the process chamber and is configured to spray the blocking gas into the process chamber. The blocking gas injector may be installed between a bottom of the substrate boat and the boat support unit, which is configured to support the substrate boat.

When the process chamber may be a process chamber for a film forming apparatus configured to grow a thin film on the substrates, the process chamber is configured to grow a thin film on each of the substrates to have a convex shape regardless of a location of the each of the substrates in the substrate boat.

According to still another aspect of the inventive concepts, a substrate processing apparatus includes a process chamber configured to stack and process a plurality of substrates loaded in a substrate boat in a horizontal manner, the process chamber having an upper end portion sealed from the outside, an lower end portion that is open, and an upper spare space disposed between the upper end portion and the substrate boat, a cover unit disposed at a lower portion of a boat support unit configured to support the substrate boat, the cover unit configured to be capable of hermetically sealing the lower end portion of the process chamber and have a lower spare space disposed under the substrate boat, a process gas supply unit configured to supply a process gas to process the substrates disposed in the process chamber through a process gas supply nozzle installed along an inner wall of the process chamber in a vertical direction of the substrate boat, an exhaust unit configured to exhaust the inside of the process chamber, and a blocking gas supply unit configured to supply a blocking gas capable of inhibiting the process gas from flowing into the upper spare space, the lower spare space, or the upper and lower spare spaces of the process chamber through a ring-type blocking gas injector that is adhered to a main body of the process chamber in a circumferential direction of the process chamber.

The ring-type blocking gas injector may include a ring body, a blocking gas line installed along the ring body and including a blocking gas introduction port capable of introducing the blocking gas, and a plurality of blocking gas spray ports capable of spraying the blocking gas introduced into the blocking gas line. The blocking gas spray ports may be installed in the blocking gas line at the same intervals.

The substrate processing apparatus may further include a main control unit configured to control the process gas supply unit, the blocking gas supply unit, and the exhaust unit. The main control unit may control the supplying of the process gas to process the substrates, the supplying of the blocking gas into the upper spare space, the lower spare space, or the upper and lower spare spaces, and the exhausting of the inside of the process chamber using the exhaust unit to be simultaneously performed.

According to yet another aspect of the inventive concepts, a substrate processing apparatus includes a process chamber configured to receive a substrate boat containing a plurality of substrates, a process gas supply unit configured to supply at least one process gas into the process chamber, a blocking gas supply unit configured to supply a blocking gas and control a flow of the process gas in the process chamber such that the process gas does not flow into at least one of an upper spare space above the substrate boat and a lower spare space below the substrate boat in the process chamber before passing over the substrates, and an exhaust unit configured to exhaust at least one of the process gas and the blocking gas from the process chamber.

The substrate boat may be configured to receive each of the substrates to be oriented in a horizontal manner such that the substrates are vertically arranged with respect to the process chamber.

The blocking gas supply unit may be at at least one of the upper spare space and the lower spare space.

The blocking gas supply unit may include a blocking gas injector provided in a circumferential direction of the process chamber and be configured to spray the blocking gas into the process chamber.

The substrate processing apparatus may further include a main control unit configured to control at least one of the process gas supply unit, the blocking gas supply unit, and the exhaust unit.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
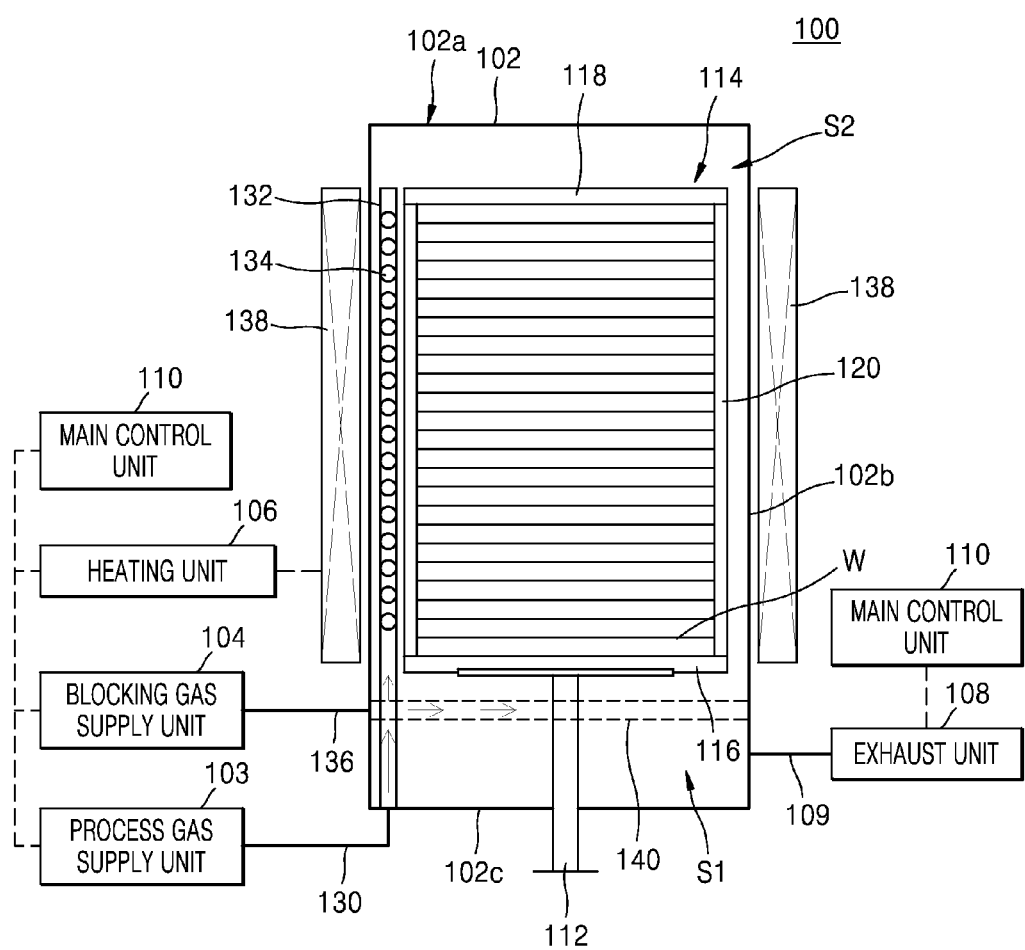
FIG. 1 is a schematic diagram of a substrate processing apparatus according to an example embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which example embodiments of the inventive concepts are shown. This inventive concepts may, however, be embodied in different forms and should not be construed as limited to the example embodiments set forth herein. Rather, these example embodiments are provided so that this disclosure is thorough and complete and fully conveys the scope of the inventive concepts to one skilled in the art. In the drawings, the thicknesses or sizes of layers and regions are exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "on", "under", "over", "below", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the example term "lower" can encompass both an orientation of lower and upper. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the inventive concepts are described herein with reference to schematic illustrations of idealized embodiments of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the inventive concepts. At least one of the following embodiments of the inventive concepts may be combined.

In the present disclosure, a substrate processing process may refer to a process of forming a semiconductor film, an insulating film, or a conductive film on a substrate (e.g., a wafer) or a glass substrate for a flat panel display (FPD), such as a liquid crystal display (LCD). The substrate processing process may refer to one of various processing processes performed to form structures including an interconnection and an electrode on the above-described substrate. The substrate processing process may refer to one of various processing processes, such as an etching process, an oxidation process, a diffusion process, a modification process, an annealing process, and a process of removing a native oxide layer in the manufacture of a semiconductor device. Also, the substrate processing process may refer to a process of cleaning the inside of a process chamber in which a substrate is loaded, as a process of manufacturing a semiconductor device on the substrate.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device.

Hereinafter, some example embodiments will be explained in further detail with reference to the accompanying drawings.

Figure 2:
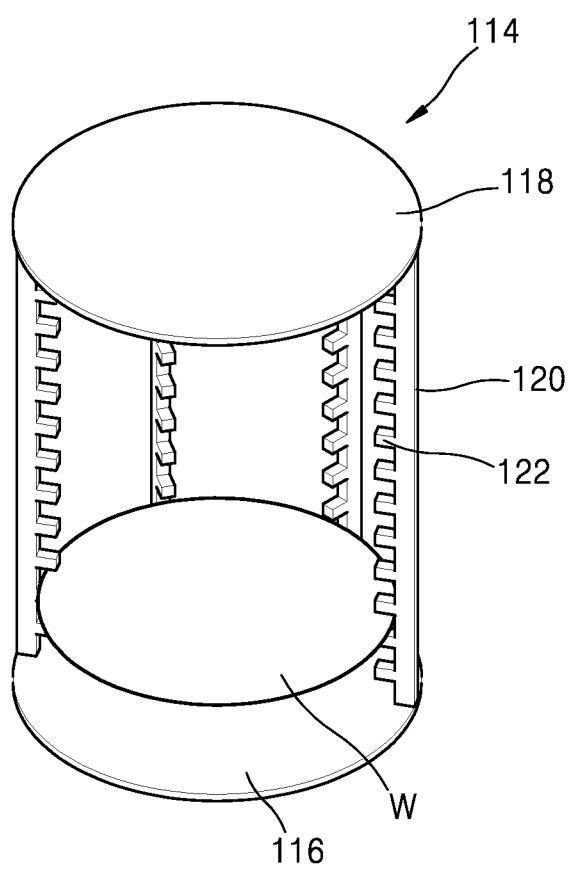
FIG. 2 is a perspective view of a substrate boat shown in FIG. 1.

FIG. 1 is a schematic diagram of a substrate processing apparatus 100 according to an example embodiment of the inventive concepts. FIG. 2 is a perspective view of a substrate boat of FIG. 1.

For example, the substrate processing apparatus 100 may include a process chamber 102 including a substrate boat 114, a process gas supply unit 103 configured to supply a process gas to the process chamber 102, and an exhaust unit 108 configured to exhaust the inside of the process chamber 102. The substrate processing apparatus 100 may include a blocking gas supply unit 104 configured to supply a blocking gas through a blocking gas injector 140 into the process chamber 102 and a heating unit 106 configured to heat the inside of the process chamber 102 by using a heater 138.

The substrate processing apparatus 100 may include a main control unit 110. The main control unit 110 may control the process gas supply unit 103, the exhaust unit 108, the blocking gas supply unit 104, and the heating unit 106.

The process chamber 102 may process a plurality of substrates (e.g., wafers) loaded in a horizontal manner. An upper end portion 102a of the process chamber 102 may be sealed from the outside, while a lower end portion 102c of the process chamber 102) lower end portion 102c may be open and communicate with the outside. The process chamber 102 may include both sidewalls 102b.

The substrate boat 114 may be loaded in the process chamber 102. The substrate boat 114 may be supported by a boat support member 112 that may be connected to a rotation and elevation mechanism (not shown). The boat support member 112 may support the substrate boat 114 and also, move the substrate boat 114 upward and downward in the process chamber 102. The substrate boat 114 may be loaded into the process chamber 102 or unloaded out of the process chamber 102 by using the boat support member 112.

The substrate boat 114 may include a upper horizontal plate 118, a lower horizontal plate 116, and a plurality of vertical support pillars 120 configured to connect the upper horizontal plate 118 and the lower horizontal plate 116. The substrates W may be mounted in slots 122 in the substrate boat 114. A plurality of substrates W may be mounted at the same interval in the substrate boat 114.

When the substrate boat 114 is loaded into the process chamber 102, an upper spare space S2 may be formed between the upper end portion 102a of the process chamber 102 and the substrate boat 114. The upper spare space S2 may be a portion in which the substrate boat 114 is not loaded.

When the substrate boat 114 is loaded into the process chamber 102, a lower spare space S1 may be formed in a lower portion of the process chamber 102. The lower spare space S1 may be a space formed under the substrate boat 114 and in which the substrate boat 114 is not loaded.

A process gas supply pipe 130 may be connected to the process gas supply unit 103. The process gas supply pipe 130 may be connected to a process gas supply nozzle 132 including a process gas spray port 134. The process gas supply nozzle 132 may be installed along an inner wall of the process chamber 102 (i.e., the inside of both sidewalls 102b) in a direction in which the substrates W are stacked. A plurality of process gas supply nozzles 132 may be provided.

The process gas supply unit 103 may supply a process gas via the process gas supply nozzle 132 to process the substrate W in the process chamber 102. The process gas may move to a top surface of the substrate W via the process gas spray port 134. The process gas may be gas for forming a thin film on the substrate W or gas for annealing the substrate W.

A blocking gas supply pipe 136 may be connected to the blocking gas supply unit 104. A blocking gas injector 140 may be connected to the blocking gas supply pipe 136. The blocking gas injector 140 may be disposed in a lower portion of the process chamber 102. The blocking gas injector 140 may be installed along a circumference of a lower portion of the process chamber 102.

The blocking gas supply unit 104 may supply a blocking gas into the process chamber 102 via the blocking gas supply pipe 136 and the blocking gas injector 140. The blocking gas may refer to a large amount of gas supplied into the lower spare space S1 of the process chamber 102. The blocking gas may refer to gas that is supplied into the lower spare space S1 of the process chamber 102 in a larger amount than the process gas. The blocking gas may be an inert gas, such as nitrogen gas, argon gas, or helium gas. When the process chamber 102 is cleaned, the blocking gas may be a cleaning gas, for example, fluorine ($F_2$) gas, nitric oxide (NO) gas, hydrogen fluoride (HF) gas, or nitrogen trifluoride ($NF_3$) gas.

An exhaust pipe 109 may be connected to the exhaust unit 108. The exhaust pipe 109 may be connected to a lower portion of the process chamber 102. The exhaust pipe 109 may be connected to the lower spare space S1. The exhaust unit 108 may exhaust the inside of the process chamber 102. The exhaust unit 108 may exhaust gas, such as a process gas or a blocking gas, from the inside of the process chamber 102 through the exhaust pipe 109.

The blocking gas supplied into the process chamber 102 through the blocking gas injector 140 may control the flow of the process gas supplied through the process gas supply unit 103. The blocking gas supplied to the lower portion of the process chamber 102 may inhibit the process gas from being supplied into the lower portion of the process chamber. For example, the main control unit 110 may control the horizontal flow of the process gas into each of upper, central, and lower portions of the process chamber 102 by controlling the process gas supply unit 103 and/or the blocking gas supply unit 104.

The substrate processing apparatus 100 may uniformly supply a process gas onto the substrate W loaded in the process chamber 102 using the blocking gas supply unit 104. Also, the substrate processing apparatus 100 may uniformly supply the process gas onto the substrate W irrespective of a position of the substrate boat 114. As a result, the substrate processing apparatus 100 may improve an in-substrate thickness uniformity of a thin film formed on the substrate W, an inter-substrate thickness uniformity of a thin film, and an inter-substrate uniformity of process gas.

Figure 3:
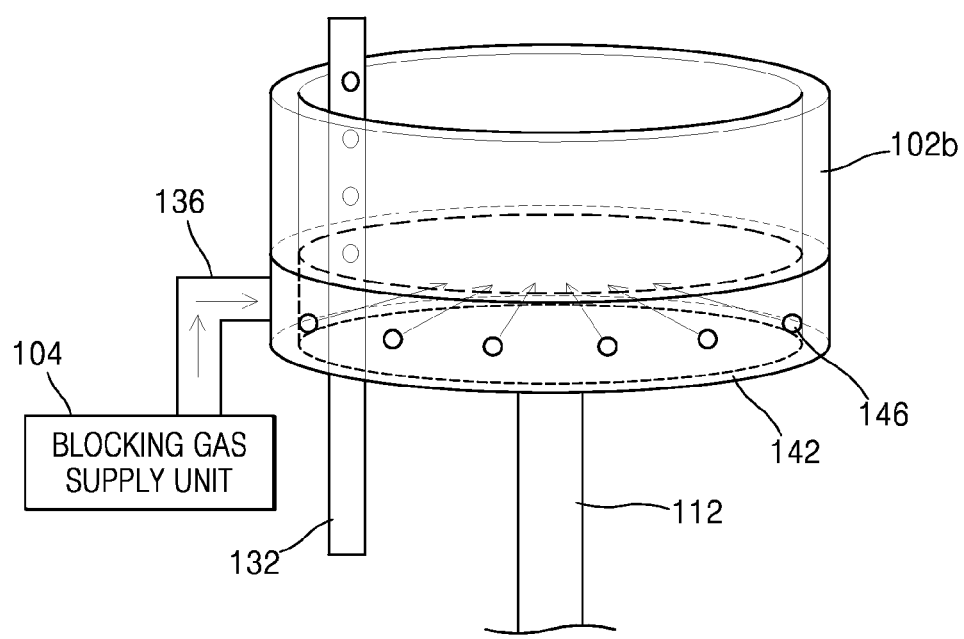
FIGS. 3 and 4 are respectively a perspective view and a plan view of a blocking gas supply unit and a blocking gas injector of FIG. 1.
Figure 4:
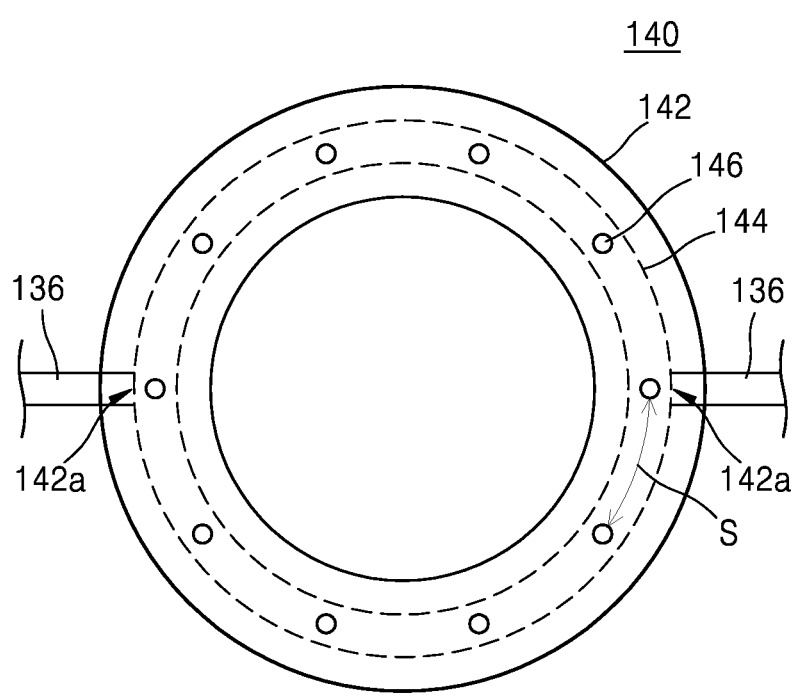

FIGS. 3 and 4 are a perspective view and a plan view of the blocking gas supply unit 104 and the blocking gas injector 140 of the substrate processing apparatus 100 of FIG. 1.

For example, the blocking gas supply unit 104 may be connected to the blocking gas injector 140. The blocking gas injector 140 may be adhered to or integrally attached to a main body (i.e., both sidewalls 102b) of the process chamber 102. The blocking gas injector 140 may constitute a unitary body (e.g., a one-piece structure) with the main body (i.e., the both sidewalls 102b) of the process chamber 102. The blocking gas injector 140 may have a ring shape, which has a hollow portion at its center.

The blocking gas injector 140 may include a ring body 142, a blocking gas line 144 installed along the ring body 142 and including a blocking gas introduction port 142a capable of introducing a blocking gas, and a plurality of blocking gas spray ports 146 configured to spray the blocking gas introduced into the blocking gas line 144. The blocking gas supply pipe 136 may be connected to the blocking gas introduction port 142a of the blocking gas line 144. The blocking gas spray ports 146 may be installed along the blocking gas line 144 at the same intervals S.

Figure 5:
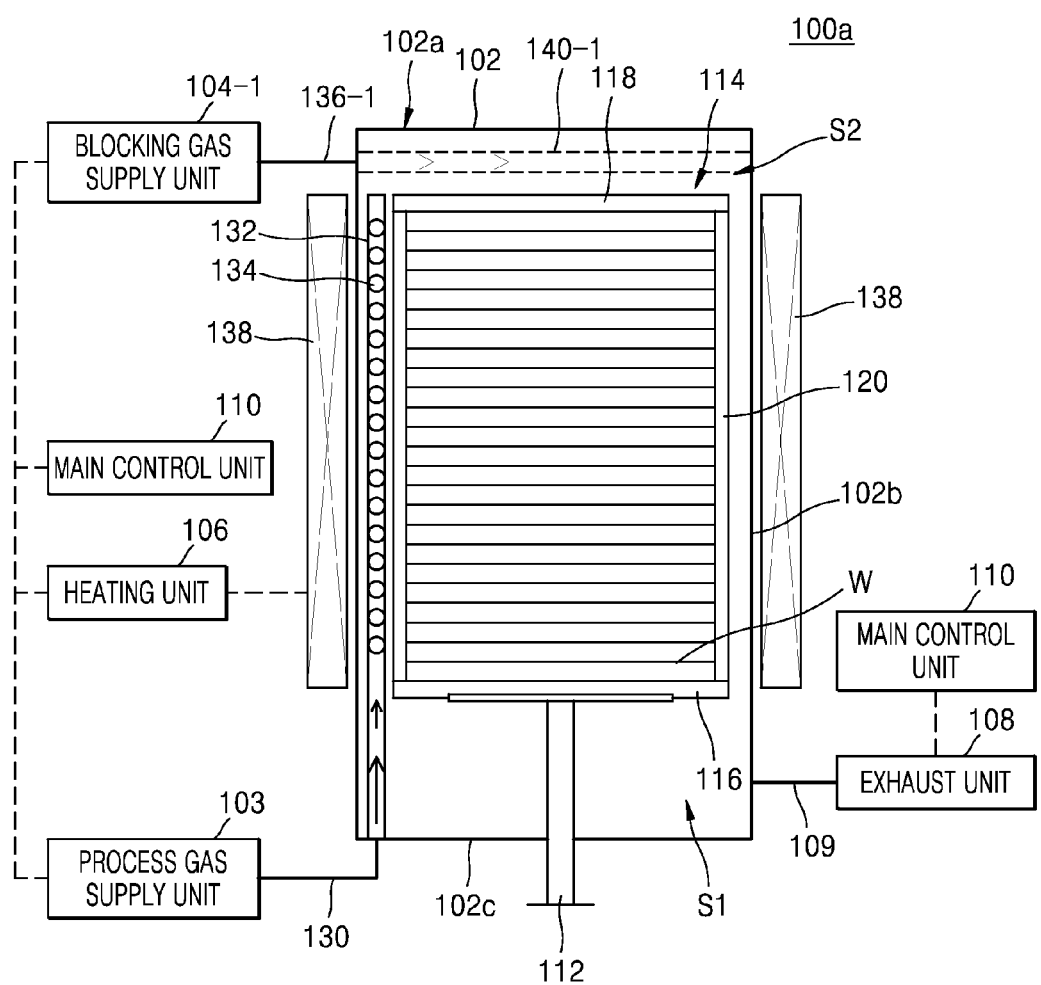
FIG. 5 is a schematic diagram of a substrate processing apparatus according to an example embodiment of the inventive concepts.
Figure 6:
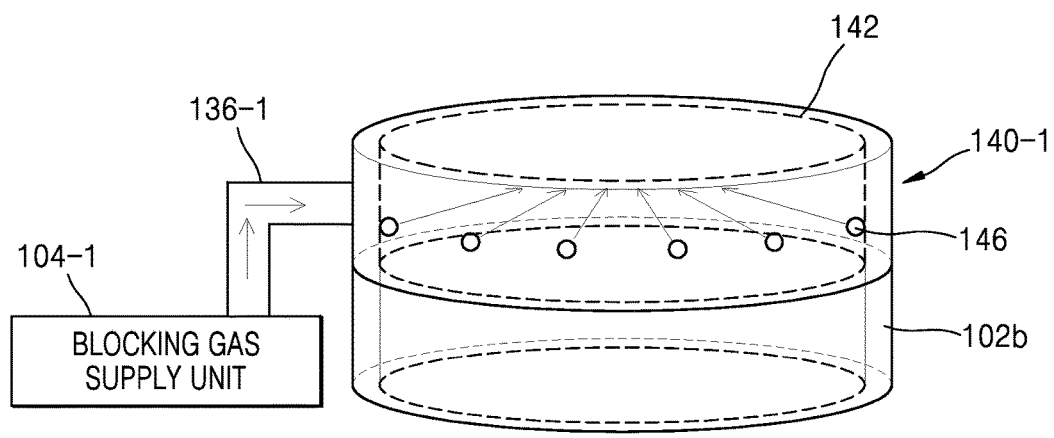
FIG. 6 is a perspective view of a blocking gas supply unit and a blocking gas injector of the substrate processing apparatus of FIG. 5.

FIG. 5 is a schematic diagram of a substrate processing apparatus 100a according to an example embodiment of the inventive concepts, and FIG. 6 is a perspective view of a blocking gas supply unit and a blocking gas injector of the substrate processing apparatus 100a of FIG. 5.

For example, the substrate processing apparatus 100a may be the same as the substrate processing apparatus 100 of FIG. 1 except that a blocking gas injector 140-1 is installed at an upper portion of a process chamber 102. Thus, descriptions of the same components as in FIGS. 1 through 3 will be omitted or simplified in FIGS. 5 and 6.

In the substrate processing apparatus 100a, the blocking gas injector 140-1 may be installed in an upper portion of the process chamber 102. The blocking gas injector 140-1 may be installed in an upper spare space S2 of the process chamber 102. The blocking gas injector 140-1 may be adhered to a main body (i.e., both sidewalls 102b) of the process chamber 102. The blocking gas injector 140-1 may be connected to a blocking gas supply pipe 136-1 and a blocking gas supply unit 104-1.

A blocking gas supplied into the process chamber 102 through the blocking gas injector 140-1 may inhibit a process gas supplied through a process gas supply unit 103 from moving to an upper portion of the process chamber 102. A main control unit 110 may control the horizontal flow of the process gas into the upper portion, a central portion, and a lower portion of the process chamber 102.

Thus, the substrate processing apparatus 100a may uniformly supply a process gas onto the substrate W loaded in the process chamber 102, by using the blocking gas supply unit 104-1 and improve an in-substrate thickness uniformity of a thin film formed on the substrate W, an inter-substrate thickness uniformity of a thin film, and an inter-substrate uniformity of process gas.

Figure 7:
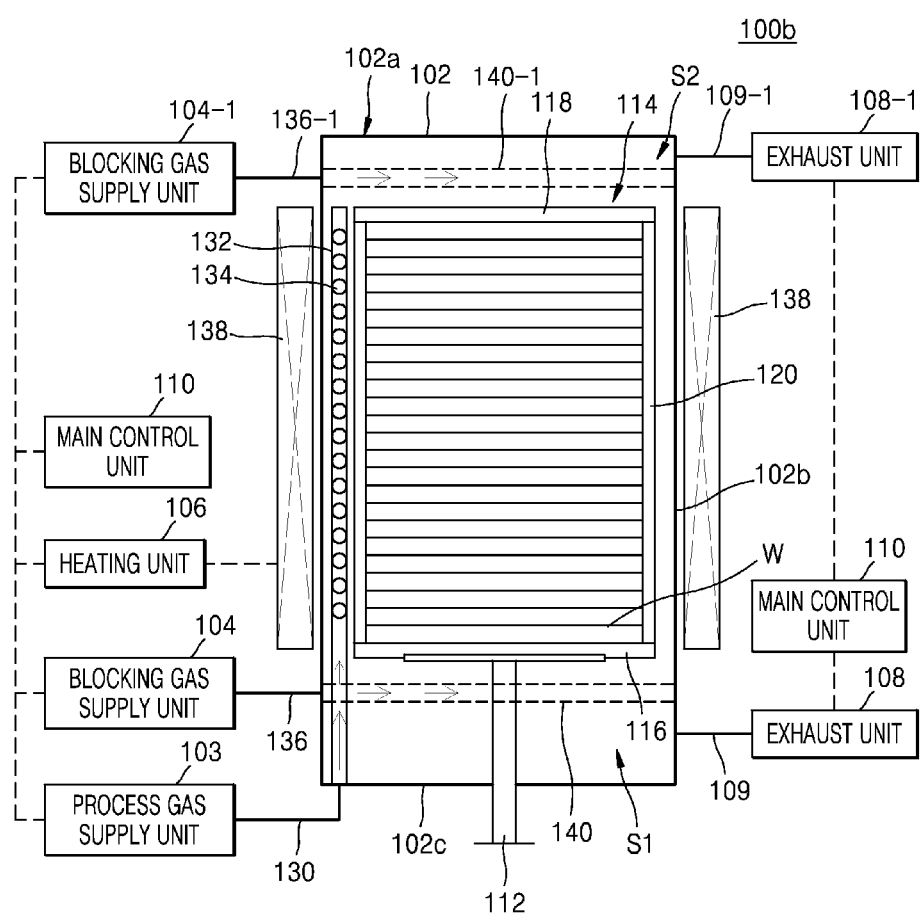
FIG. 7 is a schematic diagram of a substrate processing apparatus according to an example embodiment of the inventive concepts.

FIG. 7 is a schematic diagram of a substrate processing apparatus 100b according to an example embodiment of the inventive concepts.

For example, the substrate processing apparatus 100b may be the same as the substrate processing apparatuses 100 and 100a of FIGS. 1 and 5 except that both blocking gas injectors 140 and 140-1 and exhaust units 108 and 108-1 are installed in lower and upper portions of a process chamber 102. Thus, descriptions of the same components as in FIGS. 1 through 6 will be omitted or simplified in FIG. 7.

In the substrate processing apparatus 100b, the blocking gas injector 140 may be installed in a lower portion of the process chamber 102. The blocking gas injector 140 may be installed in a lower spare space S1 of the process chamber 102. The blocking gas injector 140 may be adhered to or integrally attached to a main body (i.e., both sidewalls 102b) of the process chamber 102. The blocking gas injector 140 may constitute a unitary body (e.g., a one-piece structure) with the main body of the process chamber 102. The blocking gas injector 140 may be connected to a blocking gas supply pipe 136 and a blocking gas supply unit 104. Furthermore, in the substrate processing apparatus 100b, an exhaust pipe 109 and an exhaust unit 108 connected to the exhaust pipe 109 may be installed at a lower portion of the process chamber 102.

In the substrate processing apparatus 100b, the blocking gas injector 140-1 may be installed in an upper portion of the process chamber 102. The blocking gas injector 140-1 may be installed in an upper spare space S2 of the process chamber 102. The blocking gas injector 140-1 may be adhered to a main body (i.e., both sidewalls 102b) of the process chamber 102. The blocking gas injector 140-1 may be connected to a blocking gas supply pipe 136-1 and a blocking gas supply unit 104-1. Furthermore, in the substrate processing apparatus 100b, an exhaust pipe 109-1 and an exhaust unit 108-1 connected to the exhaust pipe 109-1 may be installed in a upper portion of the process chamber 102.

In the substrate processing apparatus 100b, a blocking gas supplied into the process chamber 102 through the blocking gas injectors 140 and 140-1 may inhibit the process gas, which is supplied through the process gas supply unit 103, from moving upper and lower portions of the process chamber 102 irrespective of positions at which the exhaust pipes 109 and 109-1 and the exhaust units 108 and 108-1 are installed. The main control unit 110 may control the horizontal flow of a process gas into each of upper, central, and lower portions of the process chamber 102.

Thus, the substrate processing apparatus 100b may uniformly supply a process gas onto the substrate W loaded in the process chamber 102, by using the blocking gas supply units 104 and 104-1 and improve an in-substrate thickness uniformity of a thin film formed on the substrate W, an inter-substrate thickness uniformity of the thin film, and an inter-substrate uniformity of a process gas.

Figure 8:
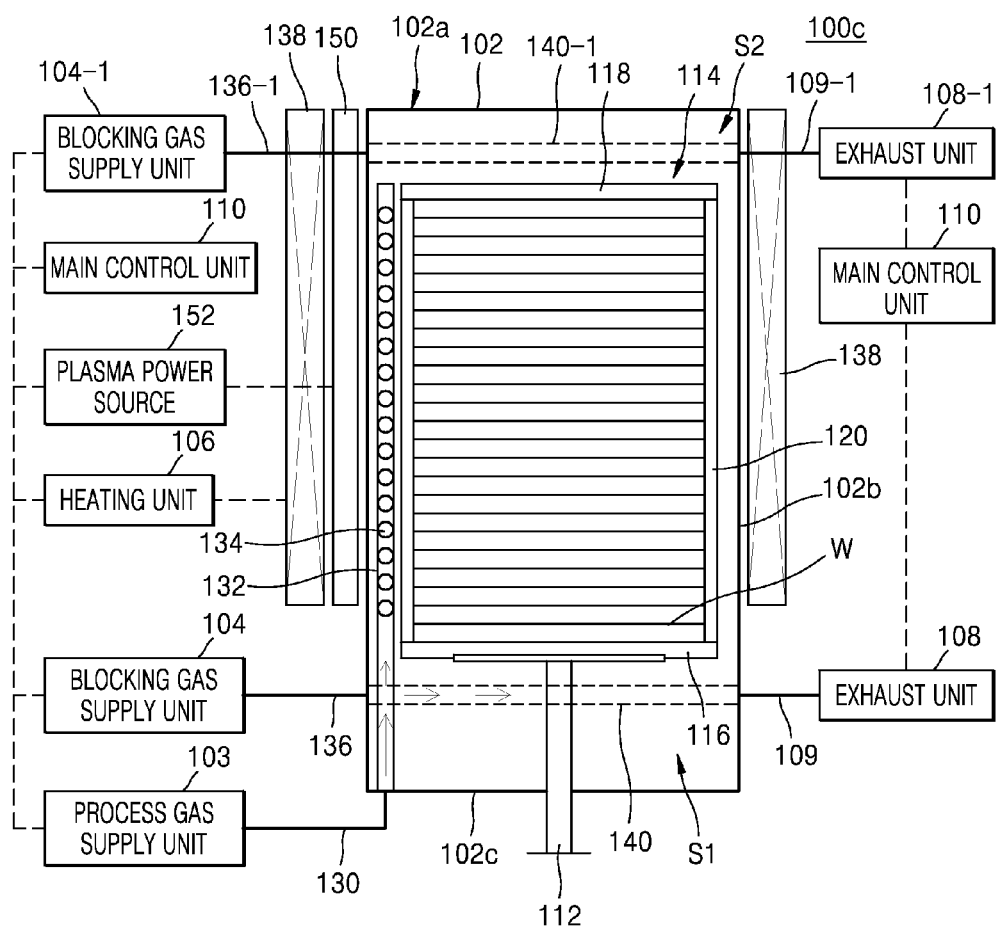
FIG. 8 is a schematic diagram of a substrate processing apparatus according to an example embodiment of the inventive concepts.

FIG. 8 is a schematic diagram of a substrate processing apparatus 100c according to an example embodiment of the inventive concepts.

For example, the substrate processing apparatus 100c may be the same as the substrate processing apparatus 100b of FIG. 7 except that a plasma generation unit 150 is installed at one side of a process chamber 102. Thus, descriptions of the same components as in FIG. 7 will be omitted or simplified in FIG. 8.

In the substrate processing apparatus 100c, a plasma generation unit 150 may be installed at one side of the process chamber 102. The plasma generation unit 150 may communicate with the process chamber 102 and excite a process gas supplied into the process chamber 102 to generate plasma. The plasma generation unit 150 may be connected to a plasma power source 152.

The substrate processing apparatus 100c may not only excite the process gas supplied into the process chamber 102 and generate plasma, but also uniformly supply the generated plasma by using blocking gas supply units 104 and 104-1. Thus, an in-substrate thickness uniformity of a thin film formed on the substrate W, an inter-substrate thickness uniformity of the thin film, and an inter-substrate uniformity of process gas may be further improved.

Figure 9:
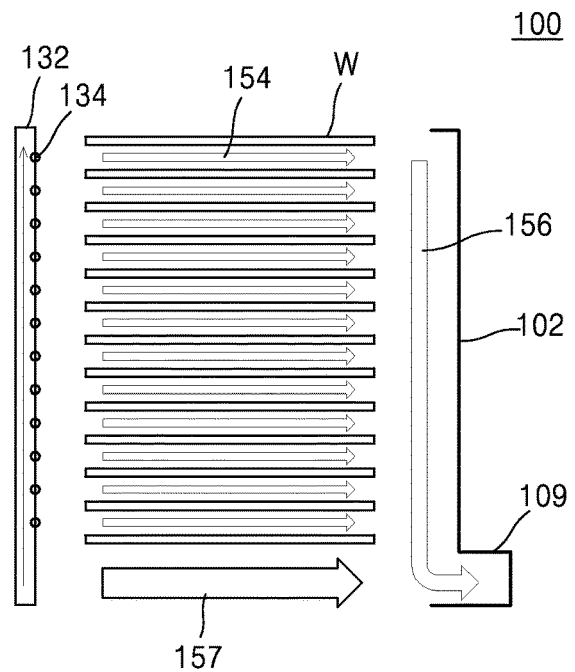
FIG. 9 is a diagram for explaining the flow of a process gas in a substrate processing apparatus according to an example embodiment of the inventive concepts.

FIG. 9 is a diagram illustrating the flow of a process gas in a substrate processing apparatus according to an example embodiment of the inventive concepts.

For example, FIG. 9 illustrates the flow of process gases 154 and 156 in a process chamber 102 of the substrate processing apparatus 100 shown in FIG. 1, according to an example embodiment of the inventive concepts. As indicated by arrows, the process gases 154 and 156 may be supplied through the process gas supply nozzle 132.

The process gas 154 sprayed through the process gas spray port 134 may move over the surface of the substrate W or through a space between the substrates W. The process gas 156 passing over the substrate W may move from an upper portion of the process chamber 102 to a lower portion thereof and be externally exhausted through the exhaust pipe 109.

The substrate processing apparatus 100 according to an example embodiment may control a flow velocity or flow rate of the process gas 154 due to a blocking gas 157 supplied through the blocking gas supply unit (refer to 103 in FIG. 1) and the blocking gas injector (refer to 140 in FIG. 1).

In other words, in the substrate processing apparatus 100, the blocking gas 157, which is supplied into the process chamber 102 through the blocking gas injector (refer to 140 in FIG. 1) may inhibit the process gas 154 from moving into the lower portion of the process chamber 102 before passing over the substrate W. Accordingly, as shown in FIG. 9, the substrate processing apparatus 100 according to an example embodiment may uniformly control the flow rate or flow velocity of the process gas 154 supplied onto a surface of the substrate W.

Figure 10:
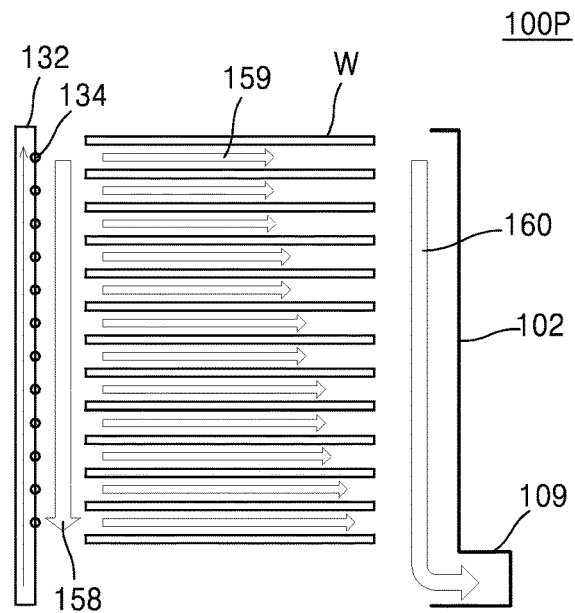
FIG. 10 is a diagram for explaining the flow of a process gas in a substrate processing apparatus according to a comparative example.

FIG. 10 is a diagram for explaining the flow of a process gas in a substrate processing apparatus 100P according to a comparative example.

For example, FIG. 10 illustrates the flow of process gases 158, 159, and 160 in the process chamber 102 when a blocking gas supply unit 104, a blocking gas supply pipe 136, and a blocking gas injector 140 are not installed in the substrate processing apparatus 100 of FIG. 1. As indicated by arrows, the process gases 158, 159, and 160 may be supplied through a process gas supply nozzle 132.

The process gas 158, which is sprayed through a process gas spray port 134, may flow into a lower portion of a process chamber 102 before passing over a substrate W. Also, the process gas 159, which is sprayed through the process gas spray port 134, may move over a surface of the substrate W or through a space between substrates W. The process gas 160, which has passed over the surface of the substrate W, may move from an upper portion of the process chamber 102 to a lower portion thereof and be externally exhausted through an exhaust pipe 109.

In the substrate processing apparatus 100P according to the comparative example, since the process gas 159 flows into the lower portion of the process chamber 102 before passing over the substrate W, a flow rate or flow velocity of the process gas 159 flowing over the surface of the substrate W or through the space between the substrates W may be reduced. In the substrate processing apparatus 100P according to the comparative example, the process gas 159 may flow at a low flow velocity or low flow rate over the surfaces of the substrates W disposed in the process chamber 102 (particularly, in the upper portion of the process chamber 102). Accordingly, in the substrate processing apparatus 100P according to the comparative example, the process gas 159 supplied onto the surface of the substrate W may not uniformly flow.

Figure 11:
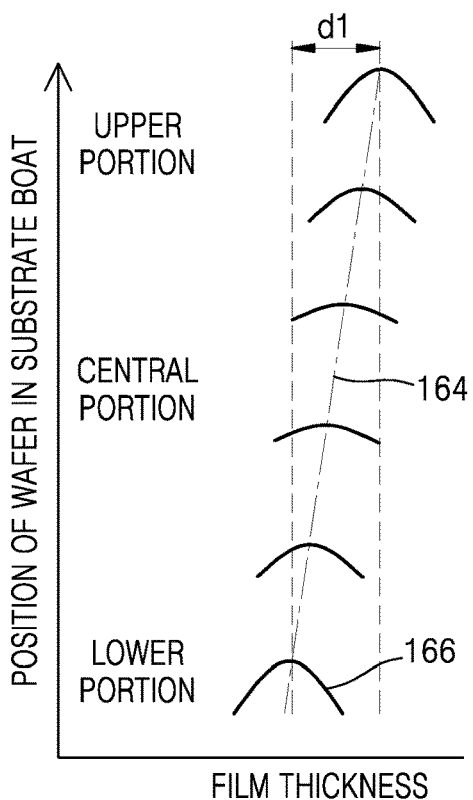
FIG. 11 is a graph showing a thickness of a formed film with respect to positions of respective substrates in the substrate boat of a substrate processing apparatus according to an example embodiment of the inventive concepts.
Figure 12:
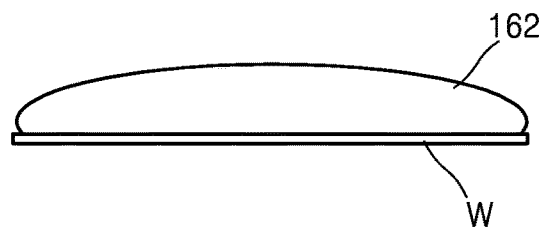
FIG. 12 illustrates a shape of a thin film formed on a substrate of FIG. 11.

FIG. 11 is a graph showing a thickness of a formed film with respect to positions of the respective substrates W in the substrate boat 114 of a substrate processing apparatus according to an example embodiment of the inventive concepts. FIG. 12 illustrates a shape of a thin film formed on a substrate of FIG. 11.

For example, FIGS. 11 and 12 illustrate a thickness of a thin film 162 relative to a vertical position of the substrate boat (refer to 114 in FIG. 1) when the thin film 162 (e.g., a silicon nitride film) is formed on a substrate W on which patterns are formed using the substrate processing apparatus 100 of FIG. 1. FIG. 12 illustrates an outer shape of the thin film 162 formed on the substrate W on which the patterns are formed.

In FIG. 11, reference numeral 164 denotes a central thickness of the thin film 162 formed on the substrate W, and 166 denotes a distribution of thicknesses of the thin film 162 formed on each of the substrates W.

When the thin film 162 is formed on the substrate W, on which patterns are formed using the substrate processing apparatus 100 of FIG. 1 as shown in FIG. 11, a distribution d1 between central thicknesses of the substrates W according to positions of the respective substrates W in the substrate boat may occur due to a difference in flow velocity or flow rate of a process gas.

As shown in FIG. 12, a surface of a thin film formed on the substrate W may have a wholly convex shape irrespective of a position of the substrates W in the substrate boat 114 by uniformly supplying the process gas. For example, a surface of a thin film formed on the substrate W disposed in an upper portion of the substrate boat may have a convex shape.

Accordingly, when the thin film 162 is formed on the substrate W on which patterns are formed using the substrate processing apparatus 100 of FIG. 1, a distribution of thicknesses of the thin film 162 according to positions of the respective substrates W in the substrate boat may be more uniformly controlled, and/or a distribution of thicknesses of the thin film 162 in each of the respective substrates may be reduced.

Figure 13:
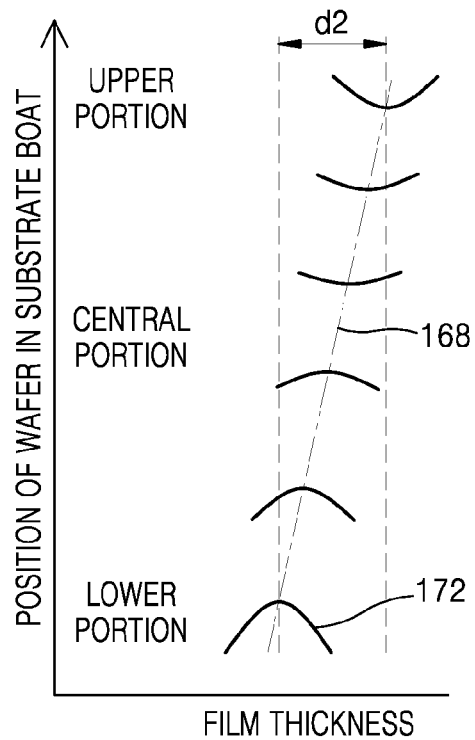
FIG. 13 is a graph showing a thickness of a formed film with respect to positions of respective substrates in the substrate boat of a substrate processing apparatus according to a comparative example.
Figure 14:
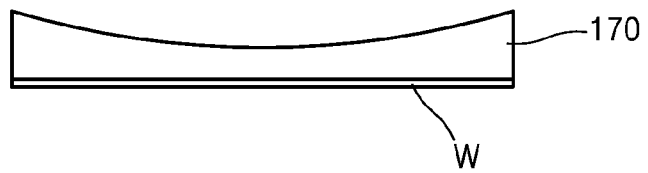
FIG. 14 illustrates a shape of a thin film formed on a substrate in an upper position of the substrate boat of FIG. 13.

FIG. 13 is a graph showing a thickness of a formed film with respect to positions of the respective substrates W in the substrate boat 114 of a substrate processing apparatus according to a comparative example. FIG. 14 illustrates a shape of a thin film formed on a substrate in an upper position of the substrate boat 114 of FIG. 13.

FIG. 13 illustrates a case in which a thin film 170, for example, a silicon nitride film, is formed on a substrate W on which patterns are formed, when a blocking gas supply unit 104, a blocking gas supply pipe 136, and a blocking gas injector 140 are not installed in the substrate processing apparatus 100 of FIG. 1.

FIG. 13 illustrates the thickness of a thin film 170 according to vertical positions of respective substrates W in the substrate boat (refer to 114 in FIG. 1). FIG. 14 illustrates a shape of the thin film 170 formed on a substrate W in an upper position of the substrate boat of FIG. 13. In FIG. 13, reference numeral 168 denotes a central thickness of the thin film 170 formed on the substrate W, and 172 denotes a distribution of thicknesses of the thin film 170 formed on each of the substrates W.

As shown in FIG. 13, a distribution d2 may occur between central thicknesses of the substrates W according to a position in the substrate boat due to a difference in flow velocity or flow rate of a process gas. For example, the distribution d2 may be greater than the distribution d1 of FIG. 11.

Furthermore, because the process gas 158 may flow into a lower portion of the process chamber 102 before passing over the substrates W as shown in FIG. 10, the process gas 159 passing over the substrates may be supplied at non-uniform flow velocities or flow rates as shown in FIG. 10. Thus, the thickness of the thin film formed on the substrate W may not have a desired uniformity with respect to positions of the substrate W in the substrate boat. For example, a surface of the thin film formed on the substrate W in a lower portion of the substrate boat may have a convex shape, while a surface of the thin film formed on the substrate W in an upper portion of the substrate boat may have a concave shape.

Accordingly, in the comparative example, it is comparatively difficult to control a distribution of thicknesses of a thin film with respect to a position of the substrate W in the substrate boat. In particular, it is difficult to achieve a desired in-wafer uniformity of thicknesses of the thin film formed on respective substrates W.

Hereinafter, a substrate processing apparatus according to specific example embodiments of the inventive concepts will be described. The specific embodiments may be embodied based on the above description, and descriptions of the same components as described above will be omitted or simplified.

Figure 15:
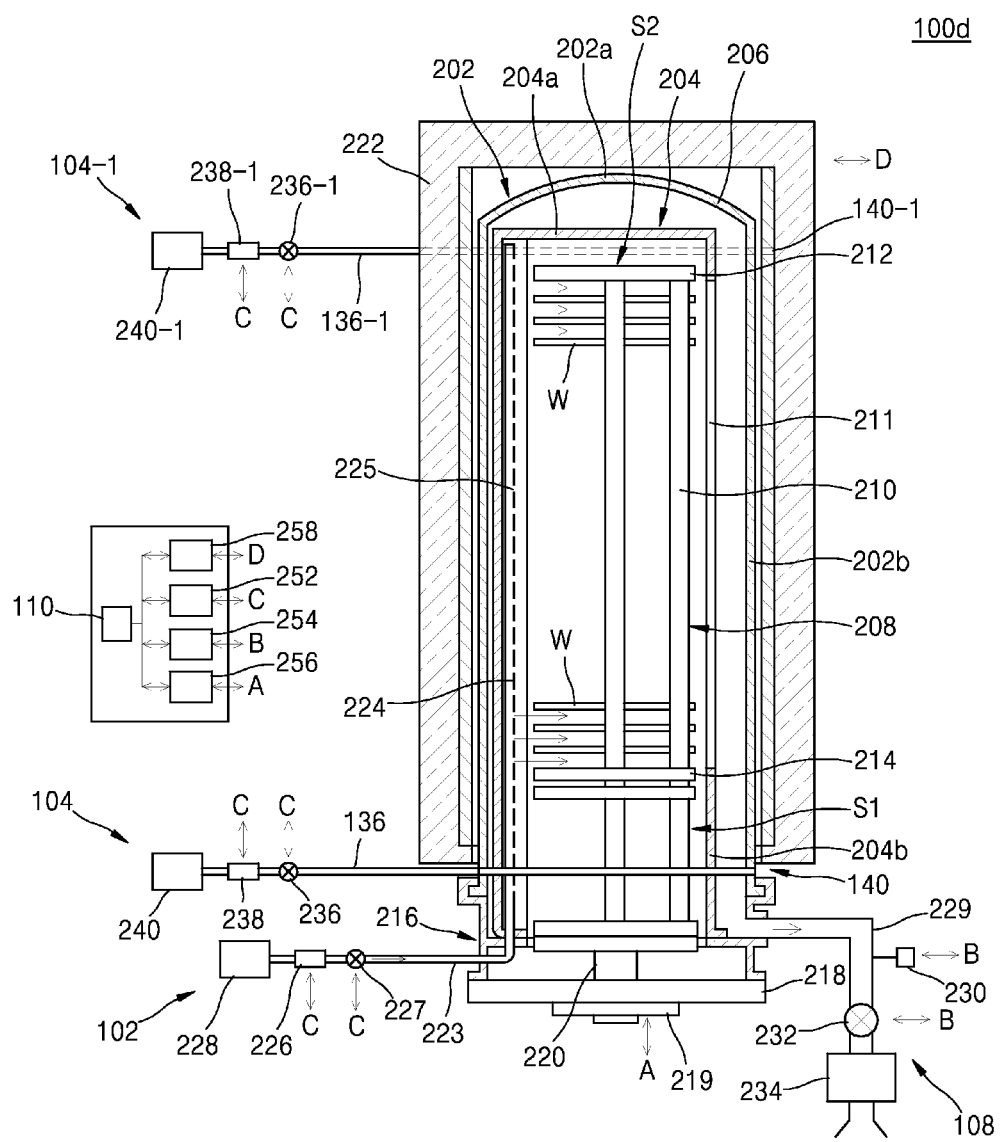
FIG. 15 is a vertical cross-sectional view of a substrate processing apparatus according to an example embodiment of the inventive concepts.
Figure 16:
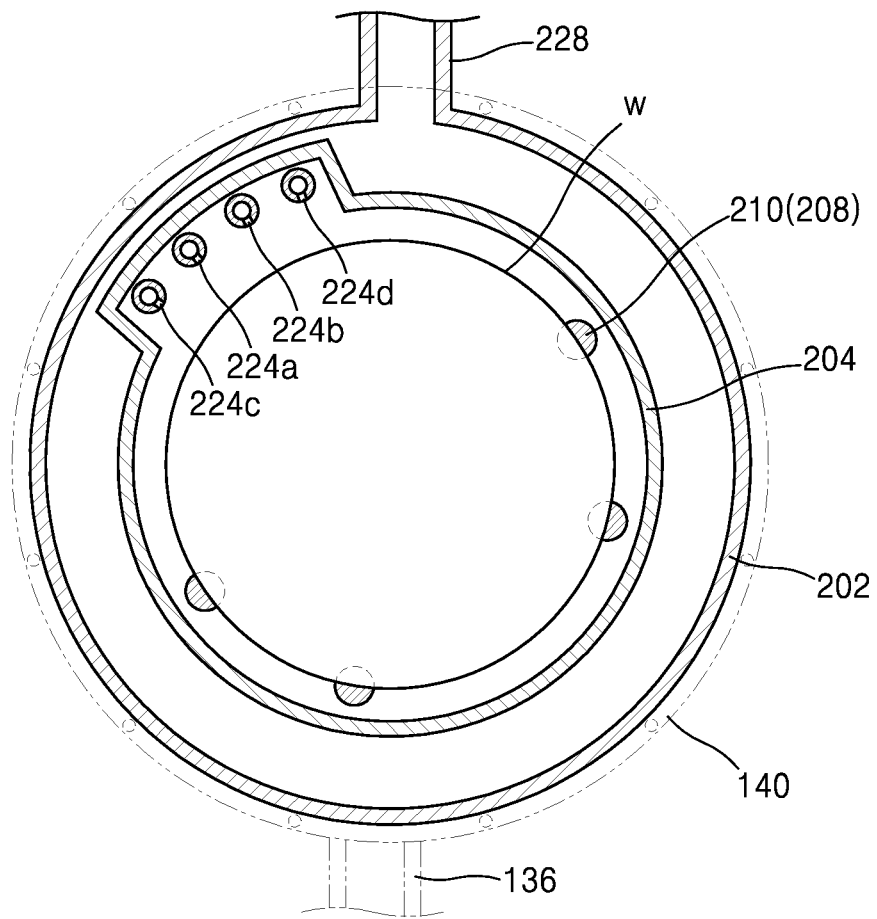
FIG. 16 is a horizontal cross-sectional view of a portion of FIG. 15.
Figure 17:
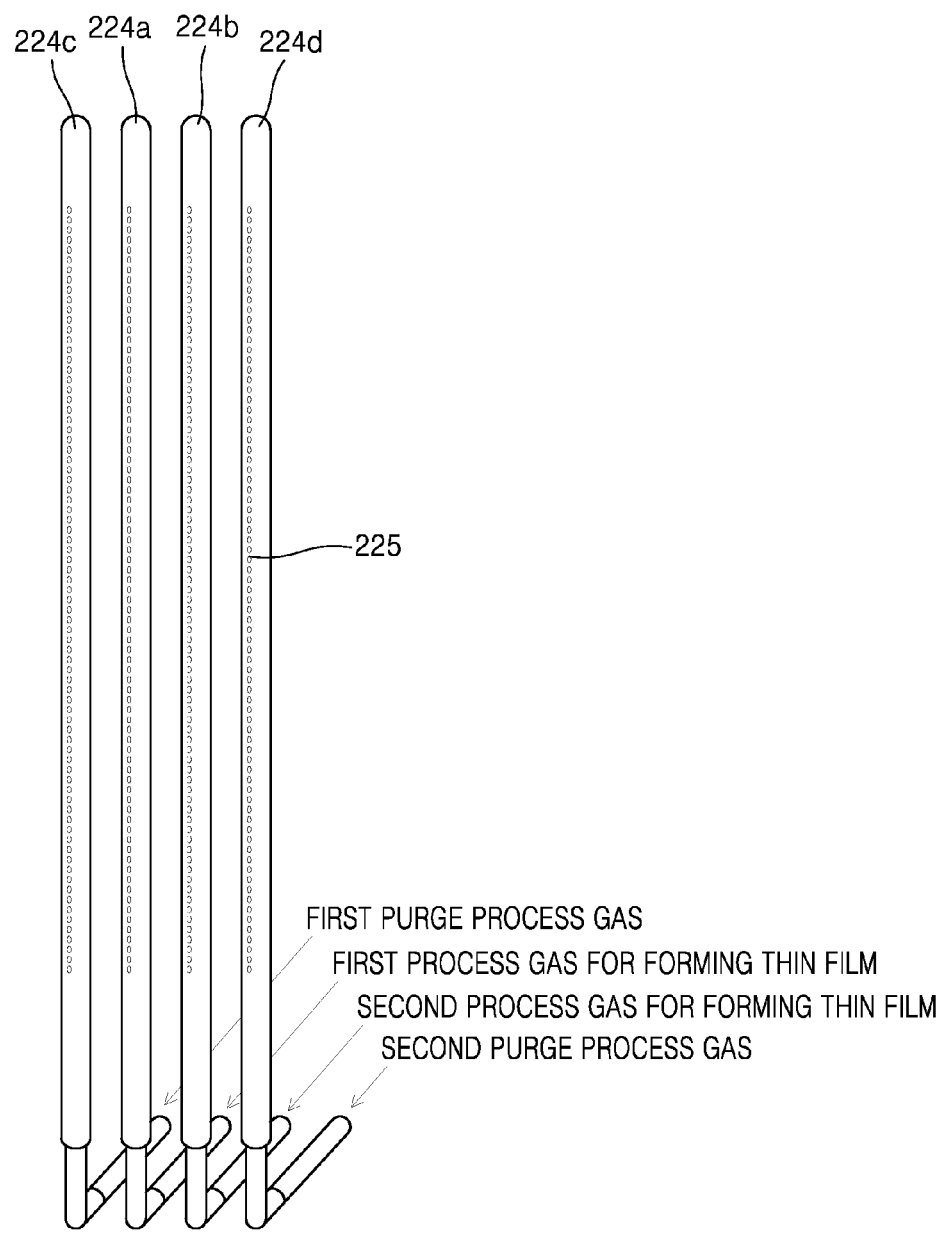
FIG. 17 is a perspective view of a process gas supply nozzle shown in FIG. 15.

FIG. 15 is a vertical cross-sectional view of a substrate processing apparatus 100d according to an example embodiment of the inventive concepts. FIG. 16 is a horizontal cross-sectional view of a portion of FIG. 15, and FIG. 17 is a perspective view of a process gas supply nozzle of FIG. 15.

For example, the substrate processing apparatus 100d may be a chemical vapor deposition (CVD) apparatus, an atomic layer deposition (ALD) apparatus, or a furnace. The substrate processing apparatus 100d may be a film forming apparatus.

The substrate processing apparatus 100d may include a process chamber 202 installed in a vertical direction (e.g., a vertical-type process chamber 202). The process chamber 202 of FIG. 15 may correspond to the process chamber 102 shown in FIGS. 1 through 8. The process chamber 202 may be referred to as a process tube. The process chamber 202 may include an inner tube 204 and an outer tube 206. The inner tube 204 and the outer tube 206 may be formed of a highly heat-resistant material, for example, quartz (SiO2) or silicon carbide (SiC). Each of the inner tube 204 and the outer tube 206 may have a cylindrical shape.

An upper end portion 204a of the inner tube 204 may be closed, and a lower end portion of the inner tube 204 may be open. The inner tube 204 may include both sidewalls 204b, and exhaust holes 211 may be formed in a portion of the both sidewalls 204b. A substrate boat 208 may be loaded and unloaded through a lower end portion of the inner tube 204. FIG. 15 illustrates a state in which the substrate boat 208 is loaded. Substrates W may be stacked in multiple stages in a horizontal manner and contained in the substrate boat 208. A processing process may be performed on the substrates W stacked in the substrate boat 208. For example, a thin film may be formed on the substrates W stacked in the substrate boat 208. A shape of the substrate boat 208 may correspond to the substrate boat 114 described above with reference to FIGS. 1 through 8.

An upper end portion 202a of the outer tube 206 may be closed, and a lower end portion of the outer tube 206 may be open. The outer tube 206 may be formed to surround the outside of the inner tube 204. A portion of the inner tube 204 above the substrate boat 208 or a portion between the inner tube 204 and the outer tube 206 above the substrate boat 208 may be an upper spare space S2 of the process chamber 202. The lower end portions of the inner tube 204 and the outer tube 206 may be combined by a manifold 216 having a ring shape. The manifold 216 may be detachably attached to the inner tube 204 and the outer tube 206 for repair and maintenance operations or a cleaning operation of the inner tube 204 and the outer tube 206.

An exhaust pipe 229 configured to exhaust an atmosphere of the process chamber 202 may be connected to, for example, a portion of a sidewall of the manifold 216. The exhaust pipe 229 may be connected to a space formed between the inner tube 204 and the outer tube 206. A pressure sensor 230, an auto pressure controller (APC) valve 232 serving as a pressure adjusting valve, and a vacuum pump 234 serving as a vacuum exhaust device may be sequentially installed at the exhaust pipe 229 from an upstream side. The vacuum pump 234 may be configured to vacuum-exhaust gases in the process chamber 202 to a desired (or alternatively, predetermined) pressure (or degree of vacuum). A pressure control unit 254 may be electrically connected to the APC valve 232 and the pressure sensor 230. The pressure control unit 254 may be controlled by a main control unit 110. The main control unit 110 of FIG. 15 may correspond to the main control unit 110 described with reference to FIGS. 1 through 8.

The pressure control unit 254 may control the opening/closing of the APC valve 232 based on a pressure detected by the pressure sensor 230 such that the inside of the process chamber 202 reaches a desired pressure. The exhaust pipe 229, the pressure sensor 230, the APC valve 232, and the vacuum pump 234 may constitute the exhaust unit 108 described with reference to FIGS. 1 through 8.

A cover unit 218 configured to hermetically seal the manifold 216 may be installed at a lower end portion of the manifold 216. The process chamber 202 also may be hermetically sealed by the cover unit 218. The cover unit 218 may be configured to move upward and downward due to an elevation and rotation member 219. Thus, the substrate boat 208 may be transferred into and out of the process chamber 202. A driving control unit 256 may be electrically connected to the elevation and rotation member 219. The driving control unit 256 may be configured to control the elevation and rotation member 219 to perform desired operations. The main control unit 110 may control a driving control unit.

The substrate boat 208 may be mounted on a boat support member 220 and supported on the cover unit 218. The substrate boat 208 may include an upper horizontal plate 212 and a lower horizontal plate 214, which are installed in a vertical direction, and a plurality of vertical support pillars 210 vertically installed between the upper horizontal plate 212 and the lower horizontal plate 214.

The substrate boat 208 may be formed of a highly heat-resistant material, such as quartz ($SiO_2$) or silicon carbide (SiC). A plurality of insulation plates may be installed at the vertical support pillars 210, which extend from the substrate boat 208, under the lower horizontal plate 214. The insulation plates may be configured to preclude transmission of heat generated by a heater 222 to the manifold 216. A space of the inner tube 204 under the substrate boat 208 or a portion in which the insulation plate 221 is installed may be a lower spare space S1 of the process chamber 202.

The heater 222, which serves as a heating mechanism for heating the inside of the process chamber 202, may be installed outside the outer tube 206. The heater 222 may be configured as a resistive heater (e.g., a carbon heater). A temperature sensor (not shown) may be installed in the process chamber 202. A temperature control unit 258 may be electrically connected to the heater 222 and the temperature sensor. The temperature control unit 258 may control a temperature in the process chamber 202. The main control unit 110 may control the temperature control unit 258. The temperature sensor and the temperature control unit 258 may correspond to the heating unit 106 described with reference to FIGS. 1 through 8.

A process gas supply nozzle 224 configured to supply a process gas into the process chamber 202 may be installed in the process chamber 202 (i.e., along an inner wall of the inner tube 204) in a direction in which the substrates W are stacked. As shown in FIG. 16, the process gas supply nozzle 224 may include a plurality of unit process gas supply nozzles 224a, 224b, 224c, and 224d.

For example, first process gas supply nozzles 224b and 224c may be portions configured to supply a process gas for forming a thin film, and second process gas supply nozzles 224a and 224d may be portions configured to supply a purge process gas.

Process gas spray ports 225 may be installed at the process gas supply nozzle 224. The process gas spray ports 225 may be installed at substantially the same level as the substrate boat 202, in which the substrates W are stacked. The process gas spray ports 225 may be installed to face the substrates W are stacked in the process chamber 202. The process gas spray ports 225 may be formed to have the same diameter so that the process gas can be supplied in a uniform amount to the substrates W. The process gas spray ports 225 may be installed to have a one-to-one correspondence with respect to a plurality of substrates W.

The process gas supply nozzle 224 may be connected to a process gas supply pipe 223. A process gas supply source 228 configured to supply a process gas, a mass flow controller (MFC) 226 may serve as a flow rate control device, and an opening/closing valve 227 may be connected to the process gas supply pipe 223. The process gas supply source 228, the MFC 226, and the opening/closing valve 227 may correspond to the process gas supply unit 103 shown in FIGS. 1 through 8. The MFC 226 and the opening/closing valve 227 may be electrically connected to a gas supply flow rate control unit 252. The gas supply flow rate control unit 252 may function to control a process gas supplied into the process chamber 202. The gas supply flow rate control unit 252 may be controlled by the main control unit 110.

As shown in FIG. 17, the process gas may include a process gas for forming a thin film on the substrate W and a purge process gas (or carrier gas). The purge process gas may be used to exhaust the remaining gas from the process chamber 202 after a reaction of the gas for forming the thin film. The purge process gas, which is a carrier process gas, may dilute the process gas for forming the thin film and facilitate diffusion of the process gas for forming the thin film that is supplied into the process chamber 202.

For example, when an aluminum (Al) film is formed on the substrate W, the process gas for forming a thin film may include, trimethyl aluminum [(CH$_3$)$_3$Al, abbreviated as TMA] gas or ozone gas, and a purge process gas may include an inert gas, for example, nitrogen gas, argon gas, or helium gas. When a silicon nitride film is formed on the substrate W, the process gas may include, for example, dichlorosilane (DCS) gas or ammonia gas, and the purge process gas may include an inert gas.

The process gas supplied from the process gas spray port 225 of the process gas supply nozzle 224 into the process chamber 202 may pass through the exhaust hole 211 and be externally exhausted through the exhaust pipe 229.

After passing through the exhaust hole 211, the process gas may be externally exhausted through the exhaust pipe 229. The exhaust hole 211 may be configured as a slit-type through hole. Blocking gas injectors 140 and 140-1 and blocking gas supply pipes 136 and 136-1 may be respectively installed in a lower spare space S1 and an upper spare space S2 of the process chamber 202. Unlike in FIG. 15, the blocking gas injector 140 may be installed only in a lower portion of the substrate boat 208.

Although FIG. 15, illustrates that the blocking gas injector 140 is adhered to and installed at the process chamber 202 (e.g., the outer tube 206), example embodiments are not limited thereto. The blocking gas injector 140 may be adhered to and installed at the process chamber 202 (e.g., the inner tube 204). For example, the blocking gas injector 140 may constitute a unitary body (e.g., a one-piece structure) with the process chamber 202 (i.e., the outer tube 206 or the inner tube 204).

Blocking gas supply units 104 and 104-1 may be installed at the blocking gas supply pipes 136 and 136-1. The blocking gas supply units 104 and 104-1 may include blocking gas supply sources 240 and 240-1 configured to supply a blocking gas, MFCs 238 and 238-1 serving as flow rate control devices, and opening/closing valves 236 and 236-1. The blocking gas may be an inert gas (e.g., nitrogen gas, argon gas, or helium gas).

The gas supply flow rate control unit 252 may serve to control a flow rate of the blocking gas supplied into the process chamber 202. The main control unit 110 may control the gas supply flow rate control unit 252. When the substrate W is processed, the main control unit 110 may control the supplying of the process gas, the supplying of the blocking gas into the upper spare space S2, the lower spare space S1, or the upper and lower spare spaces S1 and S2, and the exhausting gases from the process chamber 202 using the exhaust unit 108 to be simultaneously performed. The blocking gas supply units 104 and 104-1 and the blocking gas injector 140-1 may be the same as described above with reference to FIGS. 1 through 8.

Figure 18:
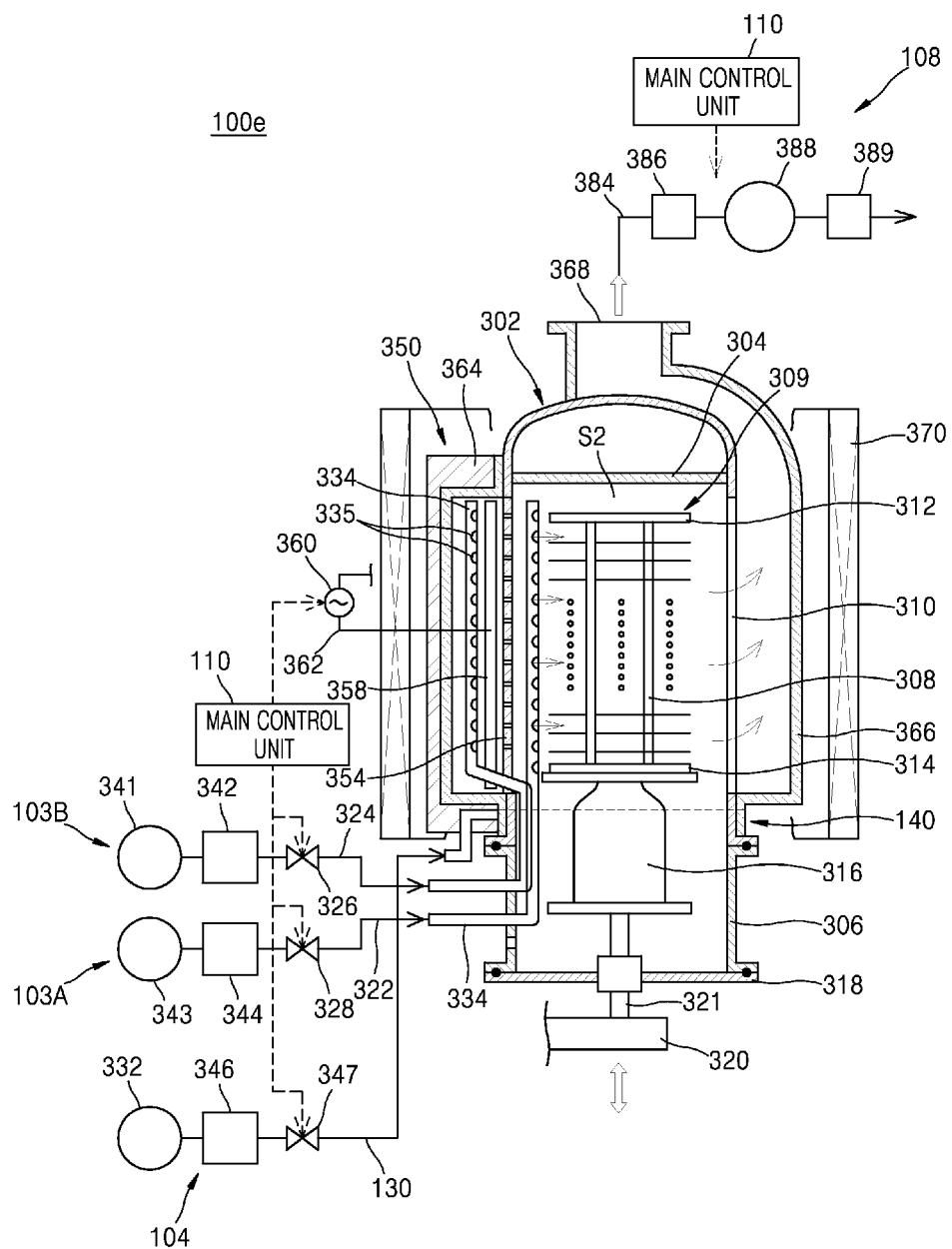
FIG. 18 is a vertical cross-sectional view of a substrate processing apparatus according to an example embodiment of the inventive concepts.
Figure 19:
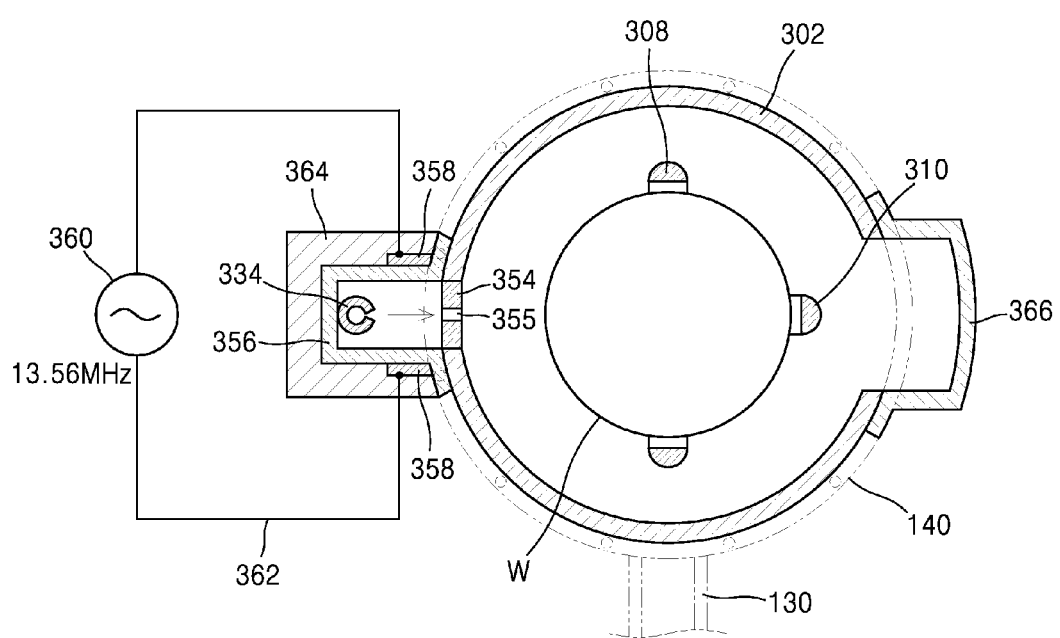
FIG. 19 is a horizontal cross-sectional view of a portion of FIG. 18.

FIG. 18 is a vertical cross-sectional view of a substrate processing apparatus 100e according to an example embodiment of the inventive concepts. FIG. 19 is a horizontal cross-sectional view of a portion of FIG. 18.

For example, the substrate processing apparatus 100e may be a film forming apparatus configured to grow a thin film using, for example, a CVD process or an ALD process.

The substrate processing apparatus 100e may include a process chamber 302 configured to contain and process a plurality of substrates W stacked in a substrate boat 309 at the same intervals. The process chamber 302 may have a cylindrical shape having a closed upper end portion and an opened lower end portion. The process chamber 302 may include an upper spare space S2 and a lower spare space S1 respectively disposed in upper and lower end portions of the substrate boat 309.

The process chamber 302 may be formed of quartz. A ceiling plate 304 may be disposed at an upper side of the process chamber 302 to hermetically seal the process chamber 302. A manifold 306 that is molded in a cylindrical shape may be installed at the lower end portion of the process chamber 302. The manifold 306 may include a metal member formed of, for example, a stainless metal, and support the lower end portion of the process chamber 302. The substrate boat 309 may be loaded and unloaded through the lower end portion of the manifold 306.

The substrate boat 309 may include an upper horizontal plate 312 and a lower horizontal plate 314, which are installed in a vertical direction, and a plurality of vertical support pillars 308 vertically installed between the upper horizontal plate 312 and the lower horizontal plate 314. Substrates W may be loaded in the substrate boat 309. FIG. 18 illustrates a state in which the substrate boat 309 is loaded. A processing process may be performed on the substrates W stacked in the substrate boat 309. For example, a thin film may be formed on the substrates W stacked in the substrate boat 309. A shape of the substrate boat 309 may correspond to the substrate boat 114 described above with reference to FIGS. 1 through 8.

The substrate boat 309 may be supported by a boat support member 320 via a thermo tank 316. The thermo tank 316 may serve to buffer (or reduce) heat transmitted from the substrate boat 309. The boat support member 320 may be connected to a rotation and elevation mechanism 321. The lower spare space S1 may correspond to a lower space under the lower horizontal plate 314 of the substrate boat 12 and the upper spare space S2 may correspond to an upper space above the upper horizontal plate 312 of the substrate boat 12.

A cover unit 318 may be installed at the lower end portion of the manifold 306 and hermetically seal the manifold 306. The process chamber 302 also may be hermetically sealed by the cover unit 318. The cover unit 318 may be configured to move upward and downward using the elevation and rotation mechanism 321.

Process gas supply pipes 322 and 324 and process gas supply units 103A and 103B connected to the process gas supply pipes 322 and 324 may be connected to one side portion of the manifold 306 to supply a process gas through a process gas supply nozzle 334 into the process chamber 302. The process gas supply nozzle 334 may penetrate a sidewall the manifold 306 inward, bend upward, and extend. Process gas spray ports 335 may be installed in the process gas supply nozzle 334 in a vertical direction facing the substrate boat 309.

The process gas supply unit 103A and 103B may include a first process gas supply unit 103A and a second process gas supply unit 103B. The process gas supply unit 103A and 103B may include process gas supply sources 341 and 343, opening/closing valves 326 and 328, and MFCs 342 and 344. The process gas supply units 103A and 103B may be controlled by a main control unit 110.

For example, the first process gas supply unit 103A may supply a first process gas containing dichlorosilane (DCS) gas as a silane-based gas. The second process gas supply unit 103B may supply, for example, a second process gas containing ammonia (NH$_3$) gas as a nitriding gas. Any one of the first process gas supply unit 103A and the second process gas supply unit 103B may be configured to supply an inert gas (e.g., N$_2$ gas) that serves as a purge gas or a carrier gas.

A plasma generation unit 350 may be disposed atone side of the process chamber 302 in a direction of the height of the process chamber 302. An exhaust hole 310 having a thin and elongate shape may be disposed at the other side of the process chamber 302 that is opposite to the one side of the plasma generation unit 350, and exhaust an inner atmosphere of the process chamber 302. The exhaust hole 310 may be provided along a sidewall of the process chamber 302, for example, in a vertical direction.

As shown in FIGS. 18 and 19, the plasma generation unit 350 may include a partition plate 354 prepared on the sidewall of the process chamber 302 and an opening 355 formed in the partition plate 354. The plasma generation unit 350 may communicate with the process chamber 302 through the opening 355. The partition plate 354 and the opening 355 may be protected by a cover member 356 adhered to an outer wall of the process chamber 302. The partition plate 354 and the cover member 356 may be formed of an insulating material, for example, quartz.

A pair of electrodes 358 may be disposed on outer side surfaces of both sidewalls of the cover member 356 to face each other in the vertical direction with respect to the opening 355. An insulating protection cover 364 formed of, for example, quartz may be installed on an outer side of the cover member 356 to cover the cover member 356. A radio-frequency (RF) power source 360 for generating plasma may be connected to the electrodes 358 through interconnection lines 362. By applying an RF voltage of about 13.56 MHz between the pair of electrodes 358, an RF electric field for exciting a process gas may be formed between the pair of electrodes 358. The RF voltage is not limited to a frequency of 13.56 MHz and may have another frequency of, for example, about 400 kHz.

A heater 370 configured to heat an inner atmosphere of the process chamber 302 and the substrate W may be disposed outside the process chamber 302. The heater 370 may be electrically connected to a heating unit 106 as shown in FIG. 1.

A process gas sprayed from the process gas spray ports of the process gas supply nozzle 334 may be excited to generate plasma in the plasma generation unit 350, and the generated plasma may be supplied into the process chamber 302. The supplied plasma may be exhausted through the exhaust hole 310 into an exhaust port 366. The exhaust port 366 may extend upward along the sidewall of the process chamber 302, and an exhaust outlet 368 may be formed above the process chamber 302. An exhaust pipe 384 may be connected to the exhaust outlet 368. A valve 386, a vacuum pump 388, and a detoxifying device 389 configured to remove undesirable toxic substances may be disposed on the exhaust pipe 384. The valve 386, the vacuum pump 388, and the detoxifying device 389 may correspond to an exhaust unit 108. The exhaust unit 108 may be controlled by the main control unit 110.

As shown in FIG. 18, a blocking gas injector 140 may be adhered to the lower spare space S1 of the process chamber 302. The blocking gas injector 140 may constitute a unitary body (e.g., a one-piece structure) with the process chamber 302. A blocking gas supply pipe 130 may be connected to the blocking gas injector 140. A blocking gas supply unit 104 may be installed at the blocking gas supply pipe 130.

The blocking gas supply unit 104 may include blocking gas supply sources 332 configured to supply a blocking gas, an MFC 346 serving as a flow rate control device, and an opening/closing valve 347. The blocking gas may be an inert gas, for example, nitrogen gas, argon gas, or helium gas. The blocking gas may be a cleaning gas for cleaning the process chamber 302. The blocking gas supply unit 104 may be controlled by the main control unit 110. The blocking gas supply unit 104 and the blocking gas injector 140 may be the same as described above with reference to FIGS. 1 through 8.

Figure 20:
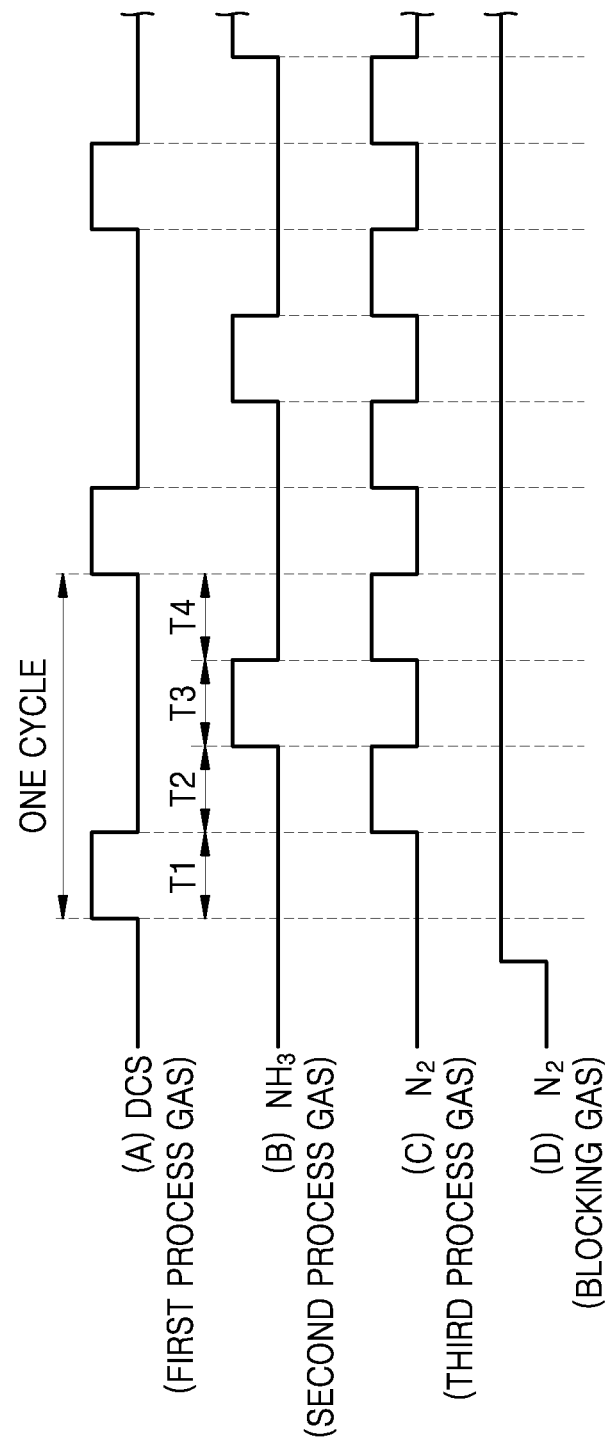
FIG. 20 is a gas flowchart illustrating an example of flows of gases in a substrate processing apparatus according to an example embodiment of the inventive concepts.

FIG. 20 is a gas flowchart illustrating an example of flows of gases in a substrate processing apparatus according to an example embodiment of the inventive concepts.

For example, FIG. 20 is an example of the flow of gases when a thin film (e.g., a silicon nitride film) is formed using the substrate processing apparatus shown in FIG. 18. FIG. 20 illustrates a case in which an ALD process is used as a film forming process. The flow of gases shown in FIG. 20 is only an example and may be variously changed.

A first process gas containing dichlorosilane (DCS) gas serving as a silane-based gas and a second process gas containing ammonia gas, which serves as a nitridation gas, may be selectively supplied into the process chamber 302, thereby forming a silicon nitride film on the substrate W. After supplying the first and second process gases, nitrogen gas may be supplied as a third gas capable of exhausting the process chamber 302. The supplying of the first through third process gases may be included in one cycle, and time durations for which the first through third process gases are supplied may be indicated by T1, T2, T3, and T4, respectively.

Furthermore, during the supplying of the first through third process gases, the blocking gas, for example, nitrogen gas, may be continuously supplied into the process chamber 302. By supplying the blocking gas, the process gases flowing into the upper and lower spare spaces S1 and S2 of the process chamber 302 may be controlled.

While the inventive concepts has been particularly shown and described with reference to example embodiments thereof, it will be understood that various changes in form and details may be made therein without departing from the spirit and scope of the following claims.

What is claimed is:
1. A substrate processing apparatus comprising:
a process chamber configured to receive and support a plurality of substrates oriented in a horizontal manner and vertically arranged with respect to the process chamber;
a first gas supply unit configured to supply at least one first gas to the process chamber through at least one first gas supply nozzle, the at least one first gas supply nozzle along an inner wall of the process chamber in a direction in which the substrates are stacked;
an exhaust unit configured to exhaust the first gas in the process chamber;
a second gas supply unit configured to supply a second gas through a gas injector to control a flow of the first gas in the process chamber, the gas injector provided in the process chamber under a support for the plurality of substrates and provided in a circumferential direction of the process chamber; and
a controller configured to control both the first gas supply unit and the second gas supply unit during a film forming process,
wherein the first gas supply unit and the second gas supply unit are different units from each other,
the support including a lower horizontal plate,
the second gas supply unit is configured to control a flow of the first gas in the process chamber by flowing the second gas into a lower space of the process chamber in a direction parallel to the lower horizontal plate, the lower space of the process chamber being a space of the process chamber under the lower horizontal plate, and the gas injector includes a plurality of gas supply ports along a circumferential direction of the process chamber and configured to spray the second gas into the process chamber.

2. The apparatus of claim 1, wherein the at least one first gas supply nozzle comprises:
a first process gas supply nozzle configured to inject a principal process gas; and
a second process gas supply nozzle configured to inject a purge process gas.

3. The apparatus of claim 1, wherein the at least one first gas supply nozzle includes a plurality of process gas spray ports configured to spray the first gas toward surfaces of the substrates to be supported on the support.

4. The apparatus of claim 1, wherein the exhaust unit is at at least one of a lower portion of the process chamber and an upper portion of the process chamber.

5. The apparatus of claim 1, wherein the gas injector is one of adhered to a main body of the process chamber and integrally attached to the main body of the process chamber.

6. The apparatus of claim 1, further comprising:
a plasma generation unit at one side of the process chamber, the plasma generation unit configured to generate plasma by exciting the at least one first gas supplied into the process chamber.

7. A substrate processing apparatus comprising:
a process chamber configured to receive a substrate boat, the substrate boat configured to accommodate a plurality of substrates oriented in a horizontal manner and vertically arranged with respect to the process chamber, the process chamber including an upper end portion and a lower end portion, the upper end portion being above the substrate boat and sealed from the outside, the lower end portion below the substrate boat and being open, the substrate boat including a lower horizontal plate;
a cover unit configured to hermetically seal the lower end portion of the process chamber;
a first gas supply unit configured to supply at least one first gas to the substrates stacked in the process chamber through a first gas supply nozzle, the first gas supply nozzle along an inner wall of the process chamber in a vertical direction of the substrate boat;
an exhaust unit configured to exhaust the first gas in the process chamber,
a second gas supply unit configured to supply a second gas through a ring type gas injector and control a flow of the first gas in the process chamber by flowing the second gas into a lower space of the process chamber in a direction parallel to the lower horizontal plate, the lower space of the process chamber being a space of the process chamber under the lower horizontal plate, the ring type gas injector provided in the process chamber under the substrates boat and provided in a circumferential direction of the process chamber; and
a controller configured to control both the first gas supply unit and the second gas supply unit during a film forming process,
wherein the ring type gas injector includes a plurality of gas supply ports along a circumferential direction of the process chamber and configured to spray the second gas into the process chamber.

8. The apparatus of claim 7, wherein the process chamber includes:
an outer tube; and
an inner tube within the outer tube and configured to accommodate the substrate boat.

9. The apparatus of claim 7, wherein the exhaust unit includes an exhaust hole at one side of the process chamber and the exhaust hole faces the first gas supply nozzle.

10. The apparatus of claim 7, wherein
the first gas supply nozzle includes a plurality of process gas spray ports configured to spray the first gas toward the substrates to be accommodated in the substrate boat, and
the ring type gas injector includes a plurality of gas spray ports configured to spray the second gas into at least one of the lower end portion hermitically sealed by the cover unit and the upper end portion.

11. The apparatus of claim 7, wherein the ring type gas injector is between a bottom of the substrate boat and a boat support unit, which is configured to support the substrate boat.

12. The apparatus of claim 7, wherein when the process chamber is a process chamber for a film forming apparatus, the process chamber is configured to grow a thin film on each of the substrates to be accommodated in the substrate boat to have a convex shape regardless of a location of the each of the substrates in the substrate boat.

13. A substrate processing apparatus comprising:
a process chamber configured to receive a substrate boat, the substrate boat configured to contain a plurality of substrates;
a first gas supply unit configured to supply at least one first gas into the process chamber;
a second gas supply unit configured to supply a second gas through a gas injector and control a flow of the first gas in the process chamber, the second gas supply unit in the process chamber under the substrate boat;
an exhaust unit configured to exhaust at least one of the first gas and the second gas from the process chamber; and
a controller configured to control both the first gas supply unit and the second gas supply unit during a film forming process,
wherein the first gas supply unit and the second gas supply unit are different units from each other,
the substrate boat including a lower horizontal plate,
the second gas supply unit configured to control a flow of the first gas in the process chamber by flowing the second gas into a lower space of the process chamber in a direction parallel to the lower horizontal plate, the lower space of the process chamber being a space of the process chamber under the lower horizontal plate, and
the gas injector includes a plurality of gas supply ports along a circumferential direction of the process chamber and configured to spray the second gas into the process chamber.

14. The substrate processing apparatus of claim 13, wherein the process chamber is configured to receive each of the substrates to be oriented in a horizontal manner such that the substrates are vertically arranged with respect to the process chamber.

* * * * *